(12) United States Patent
Kimura et al.

(10) Patent No.: US 8,638,001 B2
(45) Date of Patent: Jan. 28, 2014

(54) ADHESIVE SHEET FOR PRODUCING SEMICONDUCTOR DEVICE

(75) Inventors: Yuta Kimura, Ibaraki (JP); Yasushi Inoue, Ibaraki (JP); Takeshi Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/473,397

(22) Filed: May 16, 2012

(65) Prior Publication Data

US 2012/0295416 A1    Nov. 22, 2012

(30) Foreign Application Priority Data

May 17, 2011   (JP) ................................. 2011-110549

(51) Int. Cl.
*H01L 23/52*    (2006.01)
*H01L 23/48*    (2006.01)
*H01L 21/322*   (2006.01)

(52) U.S. Cl.
USPC ............. 257/783; 257/E21.318; 257/E21.317

(58) Field of Classification Search
USPC ............................ 257/783, E21.317, E21.318
See application file for complete search history.

(56) References Cited

U.S. PATENT DOCUMENTS

2012/0302042 A1* 11/2012 Kimura et al. ................ 438/476

FOREIGN PATENT DOCUMENTS

| JP | 2000-104040 | 4/2000 |
| JP | 2002-179769 | 6/2002 |
| JP | 2009-127042 | 6/2009 |
| JP | 2009-203338 | 9/2009 |
| JP | 2009-256630 | 11/2009 |
| JP | 2010-116453 | 5/2010 |

* cited by examiner

*Primary Examiner* — Luan C Thai
(74) *Attorney, Agent, or Firm* — Knobbe Martens Olson & Bear LLP

(57) ABSTRACT

An object of the present invention is to provide an adhesive sheet that can capture cations mixed in from outside during various processes of manufacturing a semiconductor device to prevent deterioration in electrical characteristics of a semiconductor device to be manufactured and to improve product reliability. It is an adhesive sheet for producing a semiconductor device, in which when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm.

11 Claims, No Drawings

ADHESIVE SHEET FOR PRODUCING SEMICONDUCTOR DEVICE

This application claims priority to Japanese Patent Application No. 2011-110549, filed May 17, 2011. The above-referenced application is hereby expressly incorporated by reference in its entirety.

BACKGROUND OF THE INVENTION

1. Field of the Invention

The present invention relates to an adhesive sheet for producing a semiconductor device.

2. Description of the Related Art

In recent years, stacked multi chip packages have been spread, wherein memory package chips for portable telephones or portable audio instruments are stacked into a multi-level. With progress in image processing technique or multi-functionalization of portable telephones and other instruments, an increase in the density and the integration degree of packages therefor has been promoted, as well as a decrease in the thickness thereof.

Meanwhile, when a cation (for example, a copper ion or iron ion) is mixed from the outside into a crystal substrate of a wafer in any process for semiconductor-production and then the cation reaches a circuit-forming area formed in the upper surface of the wafer, there is caused a problem that the electrical characteristic thereof is declined. When a semiconductor product is used, there is also caused a problem that a cation is generated from its circuit or wires so that the electrical characteristic is deteriorated.

Against the problems, the following attempts have been hitherto made: extrinsic gettering of working the rear surface of a wafer to form a fractured layer (strain), and capturing cations by the fractured layer so as to remove the cations (the gettering may be abbreviated to "EG" hereinafter); and intrinsic gettering of forming oxygen-precipitated defects in a crystal substrate of a wafer, and capturing cations by the oxygen-precipitated defects to remove the cations (the gettering may be abbreviated to "IG" hereinafter).

However, as the wafers have become thinner in recent years, advantageous effects of IG have been become smaller. Additionally, by removing strain in the rear surface of a wafer, which causes a crack or warp of the wafer, advantageous effects of EG come not to be gained. For these reasons, there has been a problem that sufficient advantageous effects of the getterings come not to be gained.

Hitherto, as a method for bonding semiconductor elements onto a substrate or the like, the following have been suggested: a method using a thermosetting paste resin (see, for example, JP 2002-179769 A); or a method using an adhesive sheet wherein a thermoplastic resin and a thermosetting resin are used together with each other (see, for example, JP 2000-104040 A).

An adhesive sheet containing an anion exchanger and captures chloride ions that cause corrosion of a wire to improve connection reliability, and the like have been conventionally proposed in, for example, Japanese Patent Application Laid-Open (JP-A) No. 2009-256630 (especially in claim 1 and paragraph 0044), JP-A No. 2009-127042 (especially in claim 1 and paragraph 0054), and JP-A No. 2010-116453 (especially in claim 1 and paragraph 0027). A pressure-sensitive adhesive sheet, in which an ion scavenger for capturing chloride ions and the like is added to improve humidity and heat resistance when a voltage is applied, has been conventionally proposed as an adhesive sheet in JP-A No. 2009-203338 (especially claim 1 and paragraphs 0019 and 0050).

SUMMARY OF THE INVENTION

In light of the problems, the invention has been made. An object thereof is to provide an adhesive composition of/from which a semiconductor-device-producing adhesive sheet can be made, the sheet being a sheet wherein a cation mixed from the outside in a semiconductor-device-producing process is captured, thereby preventing deterioration in the electrical characteristic of a produced semiconductor device so as to improve the product reliability of the device; and such an adhesive sheet.

The present inventors have made investigations on an adhesive sheet for producing a semiconductor device in order to solve the above-described problems of the conventional techniques. As a result, it was found that deterioration in electrical characteristics of a semiconductor device to be manufactured can be prevented and product reliability can be improved when the adhesive sheet for producing a semiconductor device is soaked in an aqueous solution containing copper ions and the solution is left under prescribed conditions, and the concentration of copper ions in the aqueous solution is 0 to 9.9 ppm, and the present invention was completed.

That is, in the adhesive sheet for producing a semiconductor device according to the present invention, when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm.

According to the above-described configuration, when an adhesive sheet for producing a semiconductor device having a weight of 2.5 g is soaked in 50 ml of an aqueous solution containing 10 ppm of copper ions, and the solution is left at 120° C. for 20 hours, the concentration of copper ions in the aqueous solution is 0 to 9.9 ppm. Therefore, cations mixed in from outside during various processes of manufacturing a semiconductor device will be captured. As a result, it becomes difficult for cations mixed in from outside to reach the surface on a wafer where a circuit is formed, deterioration in the electrical characteristics can be suppressed, and product reliability can be improved. An anion exchanger is added to the adhesive sheet and the like that have been proposed in JP-A Nos. 2009-256630, 2009-127042, and 2010-116453 to capture chloride ions that corrode copper wirings, and the documents have not disclosed that cations are captured. An ion scavenger for capturing chloride ions and the like is added in the pressure-sensitive adhesive sheet proposed in JP-A No. 2009-203338 to improve humidity and heat resistance when a voltage is applied, and the document has not disclosed that cations are captured.

In the above-described configuration, the thickness of the adhesive sheet is preferably 3 to 150 μm. By making the thickness of the adhesive sheet 3 μm or more, cations can be captured more successfully. On the other hand, by making the thickness of the adhesive sheet 150 μm or less, the thickness can be easily controlled.

In the above-described configuration, an acrylic resin having an acid value of 5 to 150 (mgKOH/g) is preferably contained. When an acrylic resin having an acid value of 5 to 150 (mgKOH/g) is contained, cations can be more successfully captured due to a synergistic effect that cations can easily move in the resin and the formation of a complex with the organic compound can be promoted.

In the above-described configuration, the water absorption rate after the adhesive sheet is left under an atmosphere of 85°

C. and 85% RH for 120 hours is preferably 3% by weight or less. When the water absorption rate after the adhesive sheet is left under an atmosphere of 85° C. and 85% RH for 120 hours is 3% by weight or less, the movement of cations in the adhesive sheet is suppressed and the cations can be more successfully captured in a semiconductor package.

In the above-described configuration, the shear adhering strength to a support member of the adhesive sheet after thermal curing is preferably 0.05 MPa or more and 1 GPa or less under a condition of 175° C. When the shear adhering strength is 0.05 MPa or more under a condition of 175° C., in a semiconductor package, the cations can easily diffuse into the adhesive sheet from the support member such as a wafer, and the cations can be more successfully captured.

In the above-described configuration, an epoxy resin is preferably contained. When an epoxy resin is contained as a curing agent, a high adhering strength of the adhesive sheet with the wafer can be obtained at a high temperature. As a result, it becomes difficult for water to enter an adhesion interface between the adhesive sheet and the wafer, and it becomes difficult for ions to move. Consequently, reliability improves.

DESCRIPTION OF THE EMBODIMENTS

In the adhesive sheet for producing a semiconductor device according to the present invention, when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm, preferably 0 to 9.5 ppm, and more preferably 0 to 8 ppm. Because when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm, cations mixed in from outside during various processes of manufacturing a semiconductor device can be captured. As a result, it becomes difficult for cations mixed in from outside to reach the surface on a wafer where a circuit is formed, deterioration in the electrical characteristics can be suppressed, and product reliability can be improved.

The thickness of the adhesive sheet for producing a semiconductor device of the present invention is preferably 3 to 150 μm, more preferably 5 to 120 μm, and further preferably 5 to 60 μm. By making the thickness of the adhesive sheet for producing a semiconductor device 3 μm or more, cations can be captured more successfully. By making the thickness of the adhesive sheet for producing a semiconductor device 150 μm or less, the thickness can be easily controlled.

The water absorption rate of the adhesive sheet for producing a semiconductor device of the present invention after the sheet is left under an atmosphere of 85° C. and 85% RH for 120 hours is preferably 3% by weight or less, more preferably 2% by weight or less, and further preferably 1% by weight or less. When the water absorption rate is 3% by weight or less, the movement of cations in the adhesive sheet is suppressed and the cations can be more successfully captured in a semiconductor package.

The shear adhering strength to a support member of the adhesive sheet for producing a semiconductor device of the present invention after thermal curing is preferably 0.05 MPa or more and 1 GPa or less, more preferably 0.1 MPa or more and 0.8 GPa or less, and further preferably 0.2 MPa or more and 0.5 GPa or less under a condition of 175° C. When the shear adhering strength is 0.05 MPa or more under a condition of 175° C., in a semiconductor package, the cations can easily diffuse into the adhesive sheet from the support member such as a wafer, and the cations can be more successfully captured.

The adhesive sheet for producing a semiconductor device of the present invention (hereinafter, also simply referred to as an "adhesive sheet") preferably contains a cation-capturing additive. When the adhesive sheet contains an cation-capturing additive, cations mixed in from outside during various processes of manufacturing a semiconductor device can be more successfully captured.

Examples of the cation-capturing additive include a cation exchanger and a complexing compound. Of these substances, a cation exchanger is preferred since the exchanger is excellent in heat resistance. A complexing compound is more preferred since a cation can be satisfactorily captured.

The cation exchanger is preferably an inorganic cation exchanger from the viewpoint of the attainment of more satisfactory cation-capturing.

In the invention, the cation captured by the cation-capturing additive is not particularly limited as far as the cation is a cation. Examples thereof include Na, K, Ni, Cu, Cr, Co, Hf, Pt, Ca, Ba, Sr, Fe, Al, Ti, Zn, Mo, Mn, and V ions.

Inorganic Cation Exchanger:

The inorganic cation exchanger is not particularly limited, and may be an inorganic cation exchanger known in the prior art. From the viewpoint of the attainment of more satisfactory cation-capturing, the inorganic cation exchanger is, for example, an oxidized hydrate of an element selected from the group consisting of antimony, bismuth, zirconium, titanium, tin, magnesium, and aluminum. These may be used alone or in combination of two or more thereof. The inorganic cation exchanger is in particular preferably an oxidized hydrate of magnesium or aluminum.

Commercially available products of the inorganic cation exchanger may be products manufactured by Toagosei Co., Ltd., examples of trade names thereof including IXE-700F, IXE-770, IXE-770D, IXE-2116, IXE-100, IXE-300, IXE-600, IXE-633, IXE-6107, and IXE-6136.

The average particle diameter of the inorganic cation exchanger is preferably from 0.05 to 20 μm, more preferably from 0.1 to 10 μm. When the average particle diameter of the inorganic cation exchanger is set to 20 μm or less, a decline in the adhesive force can be restrained. When the diameter is set to 0.05 μm, the dispersibility can be improved.

Complexing Compound:

The complexing compound is not particularly limited as far as the compound is a compound which is complexed with a cation. The complexing compound is preferably an organic complexing compound. The organic complexing compound is preferably one or more selected from the group consisting of a nitrogen-containing compound, a hydroxyl-containing compound, and a carboxyl-containing compound from the viewpoint of the attainment of satisfactory cation-capturing.

Nitrogen-Containing Compound:

The nitrogen-containing compound is preferably a compound in a fine powdery form, a compound easily soluble in an organic solvent, or a compound in a liquid form. The nitrogen-containing compound may be a triazole compound, a tetrazole compound, or a bipyridyl compound from the viewpoint of the attainment of more satisfactory cation-capturing. The nitrogen-containing compound is more preferably a triazole compound from the viewpoint of the stability of a complex formed with a copper ion. These compounds may be used alone or in combination of two or more thereof.

The triazole compound is not particularly limited, and examples thereof include 1,2,3-benzotriazole, 1-{N,N-bis(2-ethylhexyl)aminomethyl}benzotriazole, carboxybenzotriazole, 2-{2'-hydroxy-5'-methylphenyl}benzotriazole, 2-{2'-hydroxy-3',5'-di-t-butylphenyl}-5 chlorobenzotriazole, 2-{2'-hydroxy-3'-t-butyl-5'-methylphenyl}-5-chlorobenzotriazole, 2-{2'-hydroxy-3',5'-di-t-amylphenyl}benzotriazole, 2-{2'-hydroxy-5'-t-octylphenyl}benzotriazole, 6-(2-benzotriazolyl)-4-t-octyl-6'-t-butyl-4'-methyl-2,2'-methylenebisphenol, 1-(2',3'-hydroxypropyl)benzotriazole, 1-(1',2'-dicarobxydiethyl)benzotriazole, 1-(2-ethylhexylaminomethyl)benzotriazole, 2,4-di-t-bentyl-6-{(H-benzotriazole-1-yl)methyl}phenol, 2-(2-hydroxy-5-t-butylphenyl)-2H-benzotriazole, 3-(2H-benzotriazole-2-yl)-5-(1,1-dimethylethyl)-4-hydroxy, octyl-3-[3-tert-butyl-4-hydroxy-5-(5-chloro-2H-benzotriazole-2-yl)phenyl]propionate, 2-ethylhexyl 3-[3-tert-butyl-4-hydroxy-5-(5-chloro-2H-benzotriazole-2-yl) phenylpropionate, 2-(2H-benzotriazole-2-yl)-6-(1-methyl-1-phenylethyl)-4-1,1,3,3-tetramethylbutyl) phenol, 2-(2H-benzotriazole-2-yl)-4-t-butylphenol, 2-(2'-hydroxy-5'-methylphenyl)benzotriazole, 2-(2'-hydroxy-5'-t-octylphenyl)-benzotriazole, 2-(3'-t-butyl-2'-hydroxy-5'-methylphenyl)-5-chlorobenzotriazole, 2-(2'-hydroxy-3',5'-di-t-amylphenyl)benzotriazole, 2-(2'-hydroxy-3',5'-di-t-butylphenyl)-5-chlorobenzotriazole, 2-[2'-hydroxy-3,5-di(1,1-dimethylbenzyl)phenyl]-2H-benzotriazole, 2,2'-methylenebis[6-(2H-benzotriazole-2-yl)-4-(1,1,3,3-tetramethylbutyl)phenol], (2-[2-hydroxy-3,5-bis(α,α-dimethylbenzyl)phenyl]-2H-benzotriazole, and methyl 3-(3-(2H-benzotriazole-2-yl)-5-t-butyl-4-hydroxyphenyl) propionate.

Commercially available product of the triazole compound may be used without especial limitation, and may be compounds manufactured by Johoku Chemical Co., Ltd., examples of trade names thereof including BT-120, BT-LX, CBT-1, JF-77, JF-78, JF-79, JF-80, JF83, JAST-500, BT-GL, BT-M, BT-260, and BT-365; products manufactured by BASF, examples of trade names thereof including TINUVIN PS, TINUVIN P, TINUVIN P FL, TINUVIN 99-2, TINUVIN 109, TINUVIN 900, TINUVIN 928, TINUVIN 234, TINUVIN 329, TINUVIN 329 FL, TINUVIN 326, TINUVIN 326 FL, TINUVIN 571, and TINUVIN 213; and products manufactured by Everlight Chemical Industrial Corp., examples of trade names thereof include EVESORB 81, EVESORB 109, EVESORB 70, EVESORB 71, EVESORB 72, EVESORB 73, EVESORB 74, EVESORB 75, EVESORB 76, EVESORB 78, and EVESORB 80. Triazole compounds are each used also as an antirust agent.

The tetrazole compound is not particularly limited, and may be, for example, 5-amino-1H-tetrazole.

The bipyridyl compound is not particularly limited, and may be, for example, 2,2'-bipyridyl, or 1,10-phenanthroline.

Hydroxyl-Containing Compound:

The hydroxyl-containing compound is not particularly limited, and is preferably a compound in a fine powdery form, a compound easily soluble in an organic solvent, or a compound in a liquid form. The hydroxyl-containing compound may be a quinol compound, a hydroxyanthraquinone compound, or a polyphenolic compound from the viewpoint of the attainment of more satisfactory cation-capturing. A polyphenolic compound is more preferred from the viewpoint of the stability of a complex with a copper ion. These compounds may be used alone or in combination of two or more thereof.

The quinol compound is not particularly limited, and may be, for example, 1,2-benzenediol.

The hydroxyanthraquinone compound is not particularly limited, and may be, for example, alizarin, or Anthrarufin.

The polyphenolic compound is not particularly limited, and may be, for example, tannin, and a tannin derivative (such as gallic acid, methyl gallate, and pyrogallol).

Carboxyl-Containing Compound:

The carboxyl-containing compound is not particularly limited, and may be, for example, a carboxyl-containing aromatic compound and a carboxyl-containing aliphatic compound.

The carboxyl-containing aromatic compound is not particularly limited, and may be, for example, phthalic acid, picolinic acid and pyrrole-2-carboxylic acid.

The carboxyl-containing aliphatic compound is not particularly limited, and may be, for example, a higher aliphatic acid and a carboxylic acid chelating reagent.

Commercially available products of the carboxylic acid chelating reagent may be used without especial limitation. The products may be products manufactured by Chelest Corp., examples of trade names thereof including CHELEST A, CHELEST 110, CHELEST B, CHELEST 200, CHELEST C, CHELEST D, CHELEST 400, CHELEST 40, CHELEST OD, CHELEST NTA, CHELEST 700, CHELEST PA, CHELEST HA, CHELEST MZ-2, CHELEST MZ-4A, and CHELEST MZ-8.

The content of the cation-capturing additive is preferably 0.1 to 80 parts by weight, more preferably 0.1 to 50 parts by weight, and further preferably 0.1 to 20 parts by weight to 100 parts by weight of a resin component that constitutes the adhesive sheet. When the amount is set to 0.1 part or more by weight, a cation (in particular, a copper ion) can be effectively captured. When the amount is set to 80 parts or less by weight, a fall in the heat resistance or an increase in costs can be restrained.

The adhesive composition used for forming the adhesive sheet preferably contains a thermoplastic resin. It is also preferred that the composition contains a thermoplastic resin and a thermosetting resin. Examples of the thermosetting resin include phenolic resin, amino resin, unsaturated polyester resin, epoxy resin, polyurethane resin, silicone resin, and thermosetting polyimide resin. These resins may be used alone or in combination of two or more thereof. It is particularly preferred to use at least either of epoxy resin or phenolic resin. Among these, an epoxy resin is preferably used. When the adhesive composition contains an epoxy resin as a curing agent, a high adhering strength of the adhesive sheet with the wafer can be obtained at a high temperature. As a result, it becomes difficult for water to enter an adhesion interface between the adhesive sheet and the wafer, and it becomes difficult for ions to move. Consequently, reliability improves.

The epoxy resin is not particularly limited as far as the resin is ordinarily used as an adhesive composition. Examples thereof include bisphenol A type, bisphenol F type, bisphenol S type, brominated bisphenol A type, hydrogenated bisphenol A type, bisphenol AF type, biphenyl type, naphthalene type, fluorene type, phenol novolak type, o-cresol novolak type, trishydroxyphenylmethane type, tetraphenylol ethane type, and other type bifunctional or polyfunctional epoxy resins; and hydantoin type, trisglycidylisocyanurate type and glycidylamine type epoxy resins. These may be used alone or in combination of two or more thereof. Of these epoxy resins, particularly preferred are novolak type, biphenyl type, trishydroxyphenylmethane type, and tetraphenylol ethane type epoxy resins since these resins are rich in reactivity with phenolic resin as a curing agent, and are excellent in heat resistance and other properties.

The phenolic resin is a resin acting as a curing agent for the epoxy resin. Examples thereof include phenol novolak resin, phenol aralkyl resin, cresol novolak resin, tert-butylphenol novolak resin, nonylphenol novolak resin, and others novolak type resins; resol type phenolic resins; and polyoxystyrenes such as polyparaoxystyrene. These may be used alone or in combination of two or more thereof. Of these phenolic resins, particularly preferred are phenol novolak resin and phenol aralkyl resin since the resins improve the connection reliability of a semiconductor device.

The blend ratio between the epoxy resin and the phenolic resin is preferable to set the amount of the hydroxyl groups in the phenolic resin appropriately into the range of 0.5 to 2.0 equivalents per equivalent of the epoxy groups in the epoxy resin component, more preferably into the range of 0.8 to 1.2 equivalents per equivalent thereof. In other words, if the blend ratio between the two is out of the range, a sufficient curing reaction does not proceed so that properties of the epoxy resin cured product are easily deteriorated.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

The acid value of the acrylic resin is preferably 5 to 150, more preferably 10 to 145, further preferably 20 to 140, and especially preferably 20 to 40. When the adhesive sheet contains an acrylic resin having an acid value of 5 to 150, cations can be more successfully captured due to a synergistic effect that a carboxylic acid group of the acrylic resin contributes the formation of a complex and, a capturing effect of the ion scavenger is promoted. The acid value of the acrylic resin in the present invention refers to the number of milligrams of potassium hydroxide that is necessary to neutralize free fatty acid, resin acid, and the like that are contained in 1 g of a sample.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

The content by percentage of the thermosetting resin is not particularly limited as far as the film made of the composition exhibits a function as a thermosetting film at the time of heating the film under predetermined conditions. The content by percentage is preferably from 5 to 60% by weight, more preferably from 10 to 50% by weight.

About the adhesive composition, it is preferred that the composition contains epoxy resin, phenolic resin and acrylic resin and the total amount of the epoxy resin and the phenolic resin is from 10 to 2000 parts by weight for 100 parts by weight of the acrylic resin. The amount is more preferably from 10 to 1500 parts by weight, even more preferably from 10 to 1000 parts by weight. When the total amount of the epoxy resin and the phenolic resin is set to 10 parts or more by weight for 100 parts by weight of the acrylic resin, the composition can gain a bonding effect when cured, so that peeling from the sheet made of the composition can be restrained. When the total amount is set to 2000 parts or less by weight, the following can be restrained: the sheet gets brittle so as to produce a low operability.

When the adhesive sheet formed by use of the adhesive composition is beforehand crosslinked into some degree, it is preferred to add, as a crosslinking agent, a polyfunctional compound reactive with functional groups or others at terminals of molecular chains of the polymer(s) to the composition. This manner makes it possible to improve the adhesive property at high temperatures and improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

A filler may be appropriately incorporated into the adhesive composition in accordance with the purpose of the composition. The incorporation of the filler makes it possible to give electroconductivity to the adhesive sheet obtained from the adhesive composition, improve the thermal conductivity thereof, adjust the elastic modulus. The filler may be an inorganic filler or an organic filler. The filler is preferably an inorganic filler from the viewpoint of an improvement in the handle ability, an improvement in the thermal conductivity, the adjustment of the melt viscosity, the supply of thixotropy to the composition, and others. The inorganic filler is not particularly limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and non-crystalline silica. These may be used alone or in combination of two or more thereof. From the viewpoint of an improvement in the thermal conductivity, preferred are aluminum oxide, aluminum nitride, boron nitride, crystalline silica, and non-crystalline silica. From the viewpoint of a good balance between the above-mentioned individual properties, preferred is crystalline silica or non-crystalline silica. In order to attain the supply of electroconductivity thereto, an improvement in the thermal conductivity, and others, an electroconductive material (electroconductive filler) may be used as the inorganic filler. The electroconductive filler includes metallic powder of silver, aluminum, gold, copper, nickel, electroconductive alloy in a spherical form, a needle form, or a flake form, a metal oxide such as alumina, amorphous carbon black, and graphite.

The average particle diameter of the filler may be set into the range of 0.005 to 10 μm. When the average particle diameter of the filler is set to 0.005 μm or more, the wettability of the adhesive composition to an adherend and the adhesive property of the adhesive composition can be better. When the average particle diameter is set to 10 μm or less, the advantageous effects of the filler added to produce the above-mentioned individual properties can be made sufficient and further the composition can keep heat resistance certainly. The average particle diameter of the filler is a value obtained by use of, for example, a light-intensity particle size distribution meter (instrument name: LA-910, manufactured by Horiba Ltd.).

Besides the cation-capturing additive, some other additive may be appropriately incorporated into the adhesive composition as the need arises. Examples of the other additive include an anion-capturing agent, a dispersing agent, an antioxidant, a silane coupling agent, and a curing promoter. These may be used alone or in combination of two or more thereof.

The method for producing the adhesive composition is not particularly limited, and may be yielded as a solution of the adhesive composition, for example, by charging the cation-capturing additive into a vessel, optionally charging a thermosetting resin, a thermoplastic resin and other additives thereinto, dissolving these components in an organic solvent, and stirring the components into an even state.

The organic solvent is not particularly limited as far as the solvent is a solvent wherein the components constituting the adhesive composition can be dissolved, mixed or dispersed into an even state and can be used solvents known in the prior art. Examples thereof include dimethylformamide, dimethylacetoamide, N-methylpyrrolidone, ketone solvents such as acetone, methyl ethyl ketone and cyclohexanone, toluene, and xylene. Methyl ethyl ketone, cyclohexanone or the like is preferred since these solvents are quickly dried, and can be inexpensively obtained.

The adhesive sheet according to an embodiment of the invention is produced, for example, as follows: first, a solution of the adhesive composition is prepared; next, the adhesive composition solution is spread in a predetermined thickness onto a substrate separator to form a painted film; and then the painted film is dried under predetermined conditions. The substrate separator may be polyethylene terephthalate (PET), polyethylene or polypropylene; a plastic film or paper sheet that has a surface coated with a remover such as fluorine-contained remover or long-chain alkyl acrylate remover; or some other. The manner for the coating is not particularly limited, and may be, for example, roll coating, screen coating, and gravure coating. Condition for drying is, for example, as follows: the drying temperature is from 70 to 160° C. and the drying time is from 1 to 5 minutes. By this method, the adhesive sheet according to the embodiment is yielded.

Since the thus-yielded adhesive sheet contains the cation-capturing additive, the sheet can capture a cation mixed from the outside in various processes in the production of a semiconductor device. As a result, the mixed cation does not easily reach a circuit-forming area formed on the upper surface of a wafer so that deterioration of the electrical property is restrained. Thus, the product reliability of the device can be improved.

In the embodiment, the description has been made about the case of using, as main adhesive components incorporated into the adhesive composition, a thermosetting resin and a thermoplastic resin. In the invention, however, instead of a thermosetting resin and a thermoplastic resin as described above, the following inorganic materials may be incorporated as one or more main adhesive components incorporated into the adhesive composition: a ceramic material, a cement material, solder and/or some other inorganic materials.

The adhesive sheet for producing a semiconductor device is not particularly limited as far as the sheet is a sheet usable to produce a semiconductor device. Examples thereof include a die-bonding film for bonding a semiconductor chip onto an adherend such as a lead frame, a protective film for protecting the rear surface of a semiconductor chip of a flip chip type semiconductor device, and a sealing sheet used for sealing a semiconductor chip.

About the adhesive sheet, it is preferred that the tensile storage modulus at 60° C. before the sheet is thermally cured is 0.01 MPa or more and 1000 MPa or less. The elasticity is more preferably 0.05 MPa or more and 100 MPa or less, even more preferably 0.1 MPa or more and 50 MPa or less. About the adhesive sheet, the tensile storage modulus at 260° C. after the sheet is thermally cured is 0.01 MPa or more and 500 MPa or less. The elasticity is more preferably 0.03 MPa or more and 500 MPa or less, even more preferably 0.05 MPa or more and 100 MPa or less, even more preferably 0.1 MPa or more and 50 MPa or less. When the tensile storage modulus at 60° C. before the thermal curing is 0.01 MPa or more, the sheet can maintain a shape required for a film and provide a good workability. When the tensile storage modulus at 60° C. before the thermal curing is 1000 MPa or less, the sheet can gain a good wettability to an adherend. Meanwhile, when the tensile storage modulus at 260° C. after the thermal curing is 500 MPa or less, the sheet makes it possible to relieve thermal stress generated by a difference in thermal expansion coefficient between a semiconductor chip and an interposer, which is a wiring board.

The present invention provides an adhesive sheet for producing a semiconductor device having a concentration of copper ions in a solution, which is obtained by soaking 2.5 g of the adhesive sheet for producing a semiconductor device in 50 ml of an aqueous solution containing 10 ppm of copper ions and leaving the solution at 120° C. for 20 hours (hereinafter, referred to as the "concentration of copper ions after the copper ions are captured"), of 0 to 9.9 ppm. Examples of a method of making the concentration of copper ions after the copper ions are captured 0 to 9.9 ppm in the present invention include a method of introducing a functional group such as a carboxylic acid group for capturing cations to the resin component to be used and a method of performing ion injection of boron or n-type dopants besides the method of incorporating a cation-capturing additive in the adhesive sheet.

EXAMPLES

Below, preferred examples of the present invention are explained in detail. However, materials, addition amounts, and the like described in these examples are not intended to limit the scope of the present invention, and are only examples for explanation as long as there is no description of limitation in particular. Hereinafter, the word "part(s)" means part(s) by weight.

Example 1

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-70L manufactured by Nagase ChemteX Corporation, acid value 5) | 36 parts |
| (b) Epoxy resin (KI-3000 manufactured by Tohto Kasei Co., Ltd.) | 4.5 parts |
| (c) Phenol resin (MEH-7851H manufactured by Meiwa Plastic Industries, Ltd.) | 4.5 parts |
| (d) Silica filler (SO-E3 manufactured by Admatechs Co., Ltd.) | 55 parts |
| (e) Cation-capturing additive (hereinafter, referred to as a "cation scavenger") (a nitrogen-containing compound, TT-LX manufactured by Johoku Chemical Co., Ltd.) | 0.1 parts |

Example 2

An adhesive composition solution according to Example 2 was obtained in the same way as in Example 1 except that the compounded amount of the cation scavenger of (e) was changed to 0.3 parts in Example 2.

Example 3

An adhesive composition solution according to Example 3 was obtained in the same way as in Example 1 except that the compounded amount of the cation scavenger of (e) was changed to 1 part in Example 3.

Example 4

An adhesive composition solution according to Example 4 was obtained in the same way as in Example 1 except that the compounded amount of the cation scavenger of (e) was changed to 3 parts in Example 4.

Example 5

An adhesive composition solution according to Example 5 was obtained in the same way as in Example 1 except that the compounded amount of the cation scavenger of (e) was changed to 10 parts in Example 5.

Example 6

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-70L manufactured by Nagase ChemteX Corporation, acid value 5) | 40 parts |
| (b) Epoxy resin (KI-3000 manufactured by Tohto Kasei Co., Ltd.) | 5 parts |
| (c) Phenol resin (MEH-7851H manufactured by Meiwa Plastic Industries, Ltd.) | 5 parts |
| (d) Silica filler (SO-E3 manufactured by Admatechs Co., Ltd.) | 50 parts |
| (e) Cation scavenger (a nitrogen-containing compound, TINUVIN928 manufactured by BASF Japan Ltd.) | 3 parts |

Example 7

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-70L manufactured by Nagase ChemteX Corporation, acid value 5) | 40 parts |
| (b) Epoxy resin (KI-3000 manufactured by Tohto Kasei Co., Ltd.) | 5 parts |
| (c) Phenol resin (MEH-7851H manufactured by Meiwa Plastic Industries, Ltd.) | 5 parts |
| (d) Silica filler (SO-E3 manufactured by Admatechs Co., Ltd.) | 50 parts |
| (e) Cation scavenger (a nitrogen-containing compound, TINUVIN928 manufactured by BASF Japan Ltd.) | 10 parts |

Example 8

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-70L manufactured by Nagase ChemteX Corporation, acid value 5) | 36 parts |
| (b) Epoxy resin (KI-3000 manufactured by Tohto Kasei Co., Ltd.) | 4.5 parts |
| (c) Phenol resin (MEH-7851H manufactured by Meiwa Plastic Industries, Ltd.) | 4.5 parts |
| (d) Silica filler (SO-E3 manufactured by Admatechs Co., Ltd.) | 55 parts |
| (e) Cation scavenger (a nitrogen-containing compound, TINUVIN928 manufactured by BASF Japan Ltd.) | 20 parts |

Example 9

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-70L manufactured by Nagase ChemteX Corporation, acid value 5) | 40 parts |
| (b) Epoxy resin (KI-3000 manufactured by Tohto Kasei Co., Ltd.) | 5 parts |
| (c) Phenol resin (MEH-7851H manufactured by Meiwa Plastic Industries, Ltd.) | 5 parts |
| (d) Silica filler (SO-E3 manufactured by Admatechs Co., Ltd.) | 50 parts |
| (e) Cation scavenger (a hydroxyl group-containing compound, Alizarin manufactured by Tokyo Chemical Industry Co., Ltd.) | 3 parts |

Example 10

The following (a) to (e) were dissolved in methylethylketone to obtain an adhesive composition solution having a concentration of 20% by weight.

| | |
|---|---:|
| (a) Acrylic ester polymer having ethyl acrylate-methyl methacrylate as a main component (SG-700AS manufactured by Nagase ChemteX Corporation, acid value 34) | 40 parts |

-continued

| | |
|---|---|
| (b) Epoxy resin (KI-3000 manufactured by Tohto Kasei Co., Ltd.) | 4.5 parts |
| (c) Phenol resin (MEH-7851H manufactured by Meiwa Plastic Industries, Ltd.) | 4.5 parts |
| (d) Silica filler (SO-E3 manufactured by Admatechs Co., Ltd.) | 55 parts |
| (e) Cation scavenger (a nitrogen-containing compound, TINUVIN928 manufactured by BASF Japan Ltd.) | 10 parts |

Comparative Example 1

The following (a) to (d) were dissolved in methylethylketone to obtain an adhesive composition solution having a concentration of 20% by weight.

| | |
|---|---|
| (a) Acrylic ester polymer having ethyl acrylate-methyl methacrylate as a main component (SG-70L manufactured by Nagase ChemteX Corporation, acid value 5) | 36 parts |
| (b) Epoxy resin (KI-3000 manufactured by Tohto Kasei Co., Ltd.) | 4.5 parts |
| (c) Phenol resin (MEH-7851H manufactured by Meiwa Plastic Industries, Ltd.) | 4.5 parts |
| (d) Silica filler (SO-E3 manufactured by Admatechs Co., Ltd.) | 55 parts |

Comparative Example 2

The following (a) to (e) were dissolved in methylethylketone to obtain an adhesive composition solution having a concentration of 20% by weight.

| | |
|---|---|
| (a) Acrylic ester polymer having ethyl acrylate-methyl methacrylate as a main component (SG-70L manufactured by Nagase ChemteX Corporation, acid value 5) | 36 parts |
| (b) Epoxy resin (KI-3000 manufactured by Tohto Kasei Co., Ltd.) | 4.5 parts |
| (c) Phenol resin (MEH-7851H manufactured by Meiwa Plastic Industries, Ltd.) | 4.5 parts |
| (d) Silica filler (SO-E3 manufactured by Admatechs Co., Ltd.) | 55 parts |
| (e) Cation scavenger (a nitrogen-containing compound, TT-LX manufactured by Johoku Chemical Co., Ltd.) | 0.01 parts |

(Measurement of Concentration of Ionic Impurities)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 2 was applied onto a release-treated film in the same way as described above, and the solution was dried at 130° C. for 2 minutes to produce an adhesive sheet having a thickness of 20 μm. Each adhesive sheet (thickness 20 μm) was cut out into a size of 240 mm×300 mm (about 2.5 g), and it was folded in half 5 times to a size of 37.5 mm×60 mm. Then, the sheet was placed in a tightly closed cylindrical Teflon (tradename) container having a diameter of 58 mm and a height of 37 mm, and 50 ml of a 10 ppm aqueous copper (II) ion solution was added in the container. Then, the container was left in an isothermal dryer (PV-231 manufactured by ESPEC Corp.) of 120° C. for 20 hours. The film was taken out to measure the concentration of copper ions in the aqueous solution using ICP-AES (SPS-1700HVR manufactured by SII Nano Technology Inc.). The results are shown in Tables 1 and 2. An amount of decrease of the concentration of copper ions is also shown in Tables 1 and 2.

(Measurement of Tensile Storage Modulus at 60° C. Before Thermal Curing)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 2 was applied onto a release-treated film in the same way as described above, and the solution was dried at 130° C. for 2 minutes to produce an adhesive sheet having a thickness of 20 μm. The produced adhesive sheets were pasted to each other and cut into a size of 30 mm long, 10 mm wide, and 0.20 mm thick. Then, the tensile storage modulus at −40 to 300° C. was measured under conditions of a frequency of 1 Hz, a strain of 0.1%, and a temperature rise rate of 10° C./min using a viscoelasticity measuring apparatus (RSA-II manufactured by Rheometric Scientific, Inc.). The measured values at 60° C. are shown in Tables 1 and 2.

(Measurement of Tensile Storage Modulus at 260° C. after Thermal Curing)

The adhesive sheets (thickness 20 μm) according to Examples 1 to 10 and Comparative Examples 2 to 4 were produced in the same way as the measurement of tensile storage modulus at 60° C. before thermal curing. Each of the produced adhesive sheets was left in an oven of 175° C. for 1 hour, and then the tensile storage modulus at 260° C. after thermal curing was measured using a viscoelasticity measuring apparatus (RSA-II manufactured by Rheometric Scientific, Inc.). In the measurement, a measurement sample obtained by pasting the produced adhesive sheets to each other and cutting the sheets into a size of 30 mm long, 10 mm wide, and 0.20 mm thick was used. The measurement of the tensile storage modulus was performed in a temperature range of −40 to 300° C. with a frequency of 1 Hz, a strain of 0.1%, and a temperature rise rate of 10° C./min. The measured values at 260° C. are shown in Tables 1 and 2.

(Measurement of Shear Adhering Strength after Thermal Curing)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 2 was applied onto a release-treated film in the same way as described above, and the solution was dried at 130° C. for 2 minutes to produce an adhesive sheet having a thickness of 20 μm.

Each of the produced adhesive sheets was pasted to a mirror wafer having a thickness of 500 μm at 60° C., and dicing was performed to produce a chip of 5 mm×5 mm on which the adhesive sheet was pasted. The produced chip with an adhesive sheet was die-bonded to a wafer chip of 10 mm×10 mm under conditions of 120° C., 0.25 kg, and 1 s, and cured by heating at 175° C. for 1 hour. The shear adhering strength of the adhesive sheet and the wafer chip was measured using a shear tester (Dage 4000 manufactured by Dage Holdings Limited). The conditions of the shear test were a measurement speed of 500 μm/s, a measurement gap of 100 μm, and a stage temperature of 175° C. The results are shown in Tables 1 and 2.

(Measurement of Water Absorption Rate)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 2 was applied onto a release-treated film in the same way as described above, and the solution was dried at 130° C. for 2 minutes to produce an adhesive sheet having a thickness of 20 μm.

Each of the produced adhesive sheets was cut into a 20 mm square piece and heated with a dryer at 175° C. for 1 hour. Next, the water absorption rate after the cut adhesive sheet was left in a constant temperature and constant humidity tank of 85° C. and 85% RH for 120 hours was measured by a Karl Fischer moisture meter (CA-07 (a trace moisture measurement apparatus) and VA-07 (a moisture vaporization apparatus) manufactured by Mitsubishi Chemical Corporation) using a value measured after the adhesive sheet was heated at 175° C. for 1 hour as a standard. Specifically, the measurement was performed until the vaporization amount became 0.1 μg/sec under conditions of a nitrogen flow rate of 250 ml/min, a measurement temperature of 150° C., and a delay time of 1 minute, and an amount of electricity required for electrolysis was converted to a moisture content to obtain the water absorption rate. The results are shown in Tables 1 and 2.

(Measurement of Peeling Strength from Silicon Wafer)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 2 was applied onto a release-treated film in the same way as described above, and the solution was dried at 130° C. for 2 minutes to produce an adhesive sheet having a thickness of 20 μm.

A tape (BT-315 manufactured by Nitto Denko Corporation) was pasted to each of the produced adhesive sheets (on the surface opposite to the release-treated film), and the resultant was cut out into a size of 10 mm×100 mm. After that, the release-treated film was peeled and the surface of the adhesive sheet side of the produced sheet was pasted to a 6-inch mirror wafer having a thickness of 760 μm a hot plate of 60° C. The pasting was performed with a roll of 2 kg moving back-and-forth once at a speed of 30 mm/sec. A 180 degree peeling test was performed using a tensile tester (Autograph AGS-J manufactured by Shimadzu Corporation) and a load cell of 50 N at a rate of 300 mm/sec to measure the peeling strength (N/10 mm) of the adhesive sheet from the silicon wafer. The results are shown in Tables 1 and 2.

TABLE 1

|  | Example 1 | Example 2 | Example 3 | Example 4 | Example 5 |
|---|---|---|---|---|---|
| Concentration (ppm) of copper (II) ions | 9.90 | 9.80 | 9.10 | 7.74 | 0.12 |
| Amount of decrease of copper (II) ions | 0.10 | 0.20 | 0.90 | 2.26 | 9.88 |
| Tensile storage modulus (MPa) at 60° C. before thermal curing | 5.0 | 4.8 | 2.6 | 2.0 | 1.5 |
| Tensile storage modulus (MPa) at 260° C. after thermal curing | 3.0 | 2.9 | 2.5 | 4.1 | 5.2 |
| Shear adhering strength (MPa) at 175° C. after thermal curing | 1.0 | 1.5 | 2.5 | 3.5 | 3.0 |
| Water absorption rate (% by weight) | 0.2 | 0.2 | 0.2 | 0.3 | 0.3 |
| Si peeling strength (N/10 mm) | 4.0 | 4.0 | 4.0 | 3.8 | 3.1 |

|  | Example 6 | Example 7 | Example 8 | Example 9 | Example 10 |
|---|---|---|---|---|---|
| Concentration (ppm) of copper (II) ions | 7.97 | 5.15 | 1.50 | 3.29 | 1.00 |
| Amount of decrease of copper (II) ions | 2.03 | 4.85 | 8.50 | 6.71 | 9.00 |
| Tensile storage modulus (MPa) at 60° C. before thermal curing | 3.5 | 1.9 | 1.2 | 9.2 | 1.0 |
| Tensile storage modulus (MPa) at 260° C. after thermal curing | 1.9 | 1.8 | 1.0 | 2.9 | 2.3 |
| Shear adhering strength (MPa) at 175° C. after thermal curing | 1.1 | 1.1 | 0.3 | 0.6 | 1.0 |
| Water absorption rate (% by weight) | 0.3 | 0.2 | 0.2 | 0.3 | 0.4 |
| Si peeling strength (N/10 mm) | 6.0 | 6.3 | 7.1 | 3.0 | 10.5 |

TABLE 2

|  | Comparative Example 1 | Comparative Example 2 |
|---|---|---|
| Concentration (ppm) of copper (II) ions | 10.00 | 9.95 |
| Amount of decrease of copper (II) ions | 0.00 | 0.05 |
| Tensile storage modulus (MPa) at 60° C. before thermal curing | 14.2 | 10.2 |
| Tensile storage modulus (MPa) at 260° C. after thermal curing | 4.62 | 3.62 |
| Shear adhering strength (MPa) at 175° C. after thermal curing | 0.77 | 0.8 |
| Water absorption rate (% by weight) | 0.3 | 0.3 |
| Si peeling strength (N/10 mm) | 4 | 4 |

What is claimed is:

1. An adhesive sheet for producing a semiconductor device, wherein when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm.

2. The adhesive sheet for producing a semiconductor device according to claim 1, wherein the thickness of the adhesive sheet is 3 to 150 μm.

3. The adhesive sheet for producing a semiconductor device according to claim 1, comprising an acrylic resin having an acid value of 5 to 150.

4. The adhesive sheet for producing a semiconductor device according to claim 1, wherein the water absorption rate after the adhesive sheet is left under an atmosphere of 85° C. and 85% RH for 120 hours is 3% by weight or less.

5. The adhesive sheet for producing a semiconductor device according to claim 1, wherein the shear adhering strength to a support member of the adhesive sheet after thermal curing is 0.05 MPa or more and 1 GPa or less under a condition of 175° C.

6. The adhesive sheet for producing a semiconductor device according to claim 1, comprising an epoxy resin.

7. The adhesive sheet for producing a semiconductor device according to claim 1, wherein when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.5 ppm.

8. The adhesive sheet for producing a semiconductor device according to claim 1, wherein when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 8 ppm.

9. The adhesive sheet for producing a semiconductor device according to claim 1, wherein the adhesive sheet further comprises an inorganic cation exchanger.

10. The adhesive sheet for producing a semiconductor device according to claim 1, wherein the adhesive sheet comprises an adhesive composition, where the adhesive composition contains epoxy resin, phenolic resin and acrylic resin, and the total amount of the combined epoxy resin and the phenolic resin is from 10 to 2000 parts by weight relative to 100 parts by weight of the acrylic resin.

11. A method of manufacturing a semiconductor device comprising adding cation to a semiconductor device in the presence of the adhesive sheet of claim 1, whereby the adhesive sheet captures said cation, and deterioration of the electrical property of the circuit-forming area of the semiconductor device is restrained.

* * * * *

UNITED STATES PATENT AND TRADEMARK OFFICE
CERTIFICATE OF CORRECTION

PATENT NO. : 8,638,001 B2  
APPLICATION NO. : 13/473397  
DATED : January 28, 2014  
INVENTOR(S) : Kimura et al.

Page 1 of 1

It is certified that error appears in the above-identified patent and that said Letters Patent is hereby corrected as shown below:

In the Specification

In column 5 at lines 7-8, Change "1-(1',2'-dicarobxydiethyl) benzotriazole," to --1-(1',2'-dicarboxydiethyl) benzotriazole,--.

Signed and Sealed this  
Second Day of September, 2014

Michelle K. Lee  
*Deputy Director of the United States Patent and Trademark Office*